United States Patent [19]
Ray et al.

[11] Patent Number: 5,701,008
[45] Date of Patent: Dec. 23, 1997

[54] INTEGRATED INFRARED MICROLENS AND GAS MOLECULE GETTER GRATING IN A VACUUM PACKAGE

[75] Inventors: Michael Ray, Goleta; Adam M. Kennedy, Santa Barbara, both of Calif.

[73] Assignee: HE Holdings, Inc., Los Angeles, Calif.

[21] Appl. No.: 758,408

[22] Filed: Nov. 29, 1996

[51] Int. Cl.$^6$ .................................. G01J 5/08; G01J 5/06
[52] U.S. Cl. ........................ 250/352; 250/353; 250/349
[58] Field of Search ................................. 250/352, 353, 250/349

[56] References Cited

U.S. PATENT DOCUMENTS

| | | | |
|---|---|---|---|
| 5,022,725 | 6/1991 | Matsunami et al. | 250/353 |
| 5,111,049 | 5/1992 | Romano et al. | 250/352 |
| 5,401,968 | 3/1995 | Cox | 250/353 |
| 5,433,639 | 7/1995 | Zahuta et al. | 445/40 |

*Primary Examiner*—Carolyn E. Fields
*Attorney, Agent, or Firm*—W. C. Schubert; W. K. Denson-Low

[57] ABSTRACT

An infrared (IR) microlens array has a plurality of microlenses (12) aligned with respective IR detector array pixels (6) to focus incoming IR radiation onto the pixels (6) to improve the efficiency of IR detection, and a gas molecule getter grating (14) inside a vacuum-sealed Dewar assembly that houses the detector array (4) increases the surface area of the getter (15) to improve the efficiency of removing residual gas molecules from the Dewar assembly.

20 Claims, 2 Drawing Sheets

INTEGRATED INFRARED MICROLENS AND GAS MOLECULE GETTER GRATING IN A VACUUM PACKAGE

BACKGROUND OF THE INVENTION

1. Field of the Invention

This invention relates to an infrared (IR) proximity microlens array on an IR window and an integrated getter grating on which a thin film getter material is positioned to remove minute amounts of residual gas molecules to maintain a vacuum.

2. Description of the Related Art

To maintain a high degree of vacuum in a sealed vacuum container, also called a Dewar assembly, a getter has been used to trap gas molecules that slowly leak through the Dewar assembly seal or seep through the container material. Widely used getter materials include titanium, molybdenum and tantalum, which permanently capture various gas molecules such as oxygen, hydrogen, nitrogen, methane, carbon monoxide and carbon dioxide that are typically found in an outgassed vacuum-sealed Dewar assembly. The getter materials react with these gases to form oxides, carbides, hydrides and nitrides which are stable at room temperature. Therefore, the reactions are irreversible and do not involve the risk of future gas release.

Trapping of residual gas molecules in a Dewar assembly has been achieved by conventional externally fired getters, an example of which is described in U.S. Pat. No. 5,111,049, assigned to Santa Barbara Research Center, the assignee of the present invention. A getter material such as a porous mixture of titanium and molybdenum powders is placed within an Alloy 42 container, which is welded onto a tube protruding from the Dewar body. The getter material is activated by applying heat to the getter container at about 800° C. for about 10 minutes. However, the externally fired getter is large and bulky, and must be fabricated external to the Dewar body. To maintain a high degree of vacuum in a Dewar assembly that contains a modern planar IR detector array, which is typically rectangular with dimensions generally on the order of 1 cm, the use of an externally fired getter greatly increases the volume and weight of the assembly. Moreover, the getter material must be located away from the IR detector array, and external cooling must be applied to the Dewar body to prevent thermal damage to the detector array and other Dewar assembly components caused by the heat supplied to the getter. The mechanical complexity of the getter assembly and the need for an external cooler for the IR detector array increases the cost of the IR detector.

A process for fabricating the vacuum-sealed Dewar assembly is described in U.S. Pat. No. 5,433,639, which is also assigned to Santa Barbara Research Center. However, since the surface area of the deposited thin film getter is small, the amount of gas that can be removed by the getter is limited. Because the IR detectors preferably have a large fill factor which is the ratio of the detector surface area to the total substrate surface area to increase the effectiveness of detection, the percentage of surface area upon which the getter material can be deposited is therefore relatively small.

A conventional uncooled IR detector array is housed in a vacuum-sealed Dewar assembly with a planar IR window, usually made of germanium and coated with a surface coating to improve its IR transmittance. IR radiation passes through the window and strikes the detector pixels in the array. Uncooled IR detectors are typically silicon microbolometers (SMBs), which are temperature sensors that detect IR radiation by heat sensing. While it is desirable that the detector pixels occupy as much surface area of the substrate as possible, it is impractical to have a detector array with a 100% fill factor because the array would no longer comprise pixels. Moreover, the gaps between pixels provide spacing for conductive strip lines or other circuit elements that may be fabricated on the same substrate surface. Many uncooled IR detector arrays have fill factors in the range of about 60–80%. When the fill factor is less than 100%, some IR radiation strikes the gaps between the pixels and is-undetected, thereby reducing the detection efficiency.

SUMMARY OF THE INVENTION

In view of the above problems, the present invention provides a getter grating with a plurality of protrusions to increase the surface area of a getter material and thereby enhance the efficiency of removing residual gas molecules, and an integrated microlens array that includes a plurality of microlens elements aligned with respective IR detector array pixels to focus incoming IR radiation onto the pixels, thereby improving the detection efficiency.

In a preferred embodiment, the microlenses are etched into the interior IR window surface facing the detector array, and the getter grating is etched into the same window surface adjacent the edges of the IR window. The individual detector pixels in the array are aligned with respective microlenses, which are preferably convex to focus incoming IR radiation onto the active pixel areas. This allows for a large fill factor and thus an increase in the detection efficiency. The getter grating is coated with a layer of getter material such as titanium, tantalum or molybdenum, preferably by metal vapor deposition.

These and other features and advantages of the invention will be apparent to those skilled in the art from the following detailed description, taken together with the accompanying drawings, in which:

BRIEF DESCRIPTION OF THE DRAWINGS

FIG. 3a is a perspective view of the IR window of FIG. 1 with a microlens array and a getter grating;

FIG. 3b is an enlarged perspective view of the getter grating of FIG. 2b showing its rectangular columns.

DETAILED DESCRIPTION OF THE INVENTION

The invention provides a getter grating to increase the surface area of a getter material and thereby improve the efficiency of removing gas molecules in a vacuum-sealed Dewar assembly, and an infrared (IR) microlens array that includes a plurality of microlens elements aligned with respective IR detector array pixels on a detector substrate to focus incoming IR radiation onto the pixels and improve the efficiency of IR detection. The getter grating and the IR microlens array are preferably etched into an IR window, which is preferably sealed to the detector substrate by a solder seal. The IR window, the substrate and the seal together form an airtight Dewar assembly with a vacuum interior.

Figure 1:
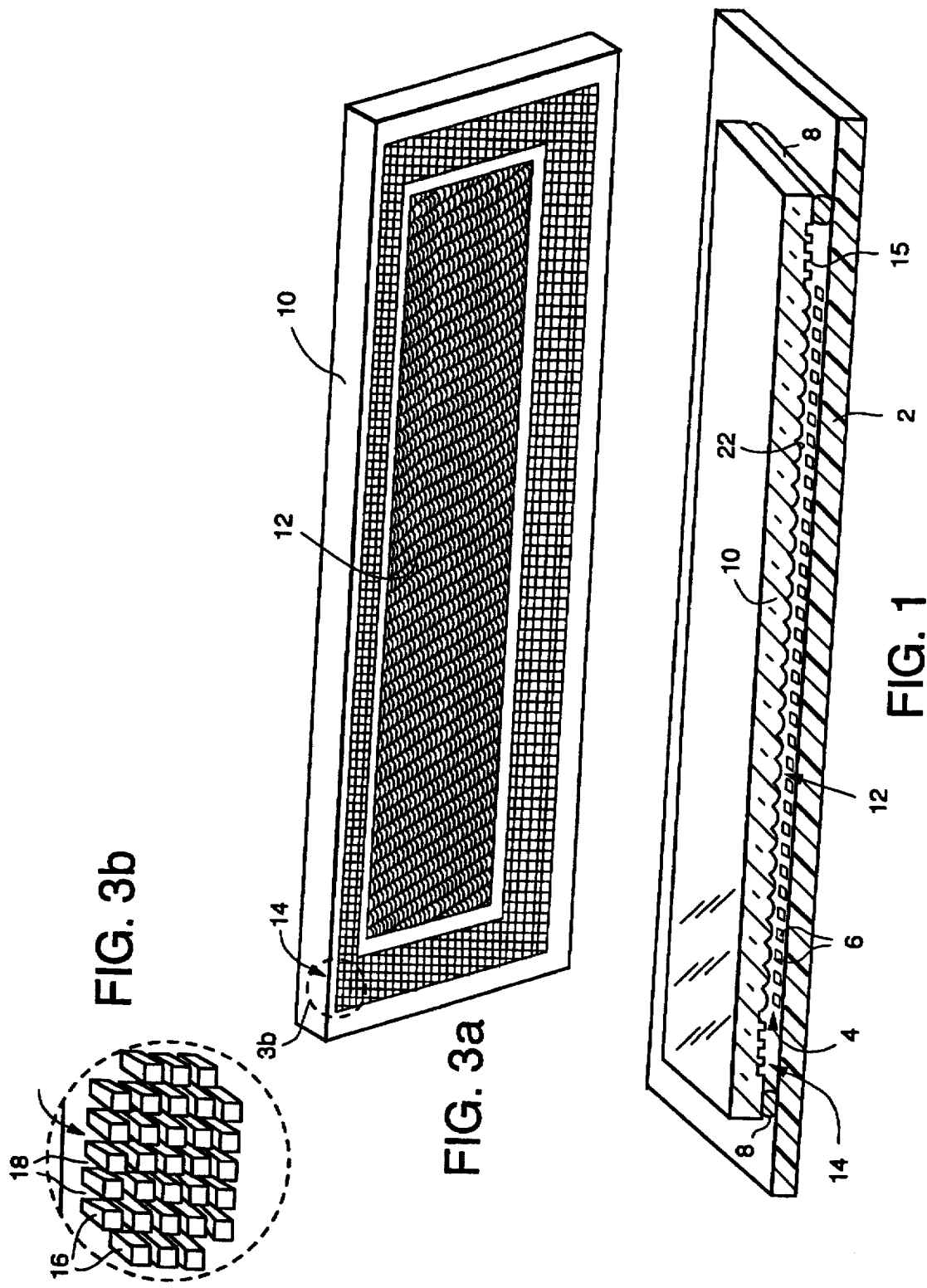
FIG. 1 is a simplified cutaway perspective view of a Dewar assembly for an IR detector array in accordance with the invention.
Figure 2:
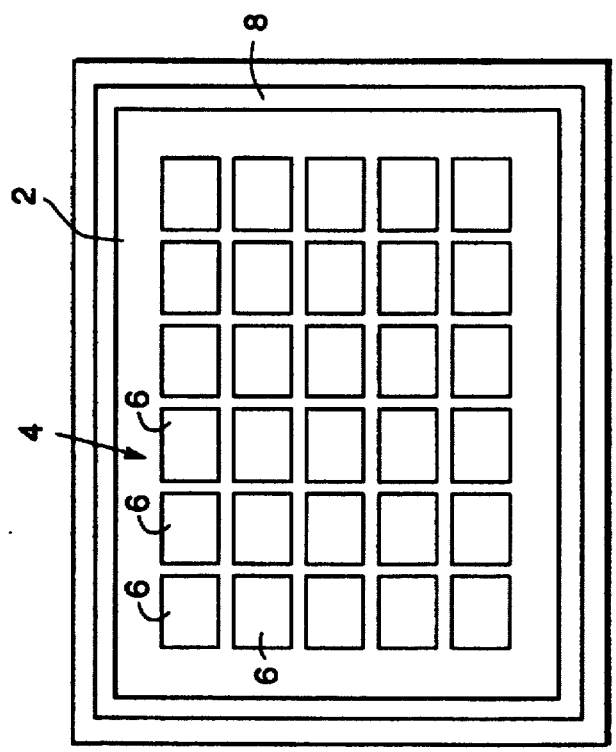
FIG. 2 is a simplified plan view of the IR detector array of FIG. 1.

In accordance with the invention, the Dewar assembly, a preferred embodiment of which is shown in FIGS. 1 and 2, has a readout integrated circuit (ROIC) substrate 2 of a semiconductor material, preferably silicon. An IR detector array 4 is positioned on the substrate and includes a plurality of individual detector elements, also called pixels, 6. Although FIG. 2 shows only a 5+6 rectangular array of detector pixels, an IR integrated circuit generally includes a planar IR detector array with up to several hundred by several hundred pixels. In most commercial applications, IR detectors are usually uncooled and detect the intensity of IR radiation by sensing increases in temperature which result from the heat imparted to the detectors by the IR radiation. A typical example of an uncooled IR detector is a silicon microbolometer (SMB), in which a plurality of individual detectors are usually formed in an array on the ROIC substrate by conventional semiconductor manufacturing processes. The SMB array detects IR radiation by sensing the IR-generated heat, and is also called a focal plane array (FPA) or a sensor chip assembly (SCA). The substrate is an integrated circuit used to process the signal produced by the bolometers. In this case the bolometer is a microbridge resistor that changes its resistance when it is heated up. The incoming radiation causes a change in the temperature of the microbridge. Although other semiconductor materials may be used, silicon is a commonly available and cost effective material that is suitable for most commercial IR detection applications.

The new vacuum-sealed Dewar assembly includes a seal 8 surrounding the IR detector array to seal off the detector array from the atmosphere. The seal can be an indium, tin or lead solder, or a vacuum epoxy with the height of the seal precisely controlled when it is deposited on the substrate 2. The seal 8 supports an IR window 10, which includes an array of microlenses and a getter grating, which includes a plurality of protrusions spaced by a plurality of recesses. The protrusions are preferably rectangular columns for ease of manufacture, but other shapes can also be used to increase the surface area of the grating. A detailed perspective view of the IR window is shown in FIG. 3a, which illustrates a preferred embodiment of an etched microlens array 12 in a center portion of the IR window surface facing the detector array and a getter grating 14 in another portion of the same surface adjacent the edges of the IR window. Although it is preferred that the getter grating portion surround the microlens array portion so that the getter traps residual gas molecules relatively evenly inside the Dewar body, the getter grating can be implemented at other locations inside the Dewar body as long as it does not block IR radiation from striking the detector array. Germanium is the preferred material for the IR window because it has a wide transmittance spectrum with a usable wavelength range of about 2-50 μm. Depending upon the wavelengths of the IR radiation that are sought to be detected, IR windows with narrower transmittance spectra can be used, but germanium windows cover the broadest spectrum and are relatively inexpensive and widely available. The surface on which the microlenses and the getter grating are formed faces the substrate and is positioned inside the Dewar assembly when it is sealed. An enlarged perspective view of the getter grating in FIG. 3b shows in detail a plurality of rectangular columns 16 and gaps forming a plurality of recesses 18 between the columns.

Figure 4:
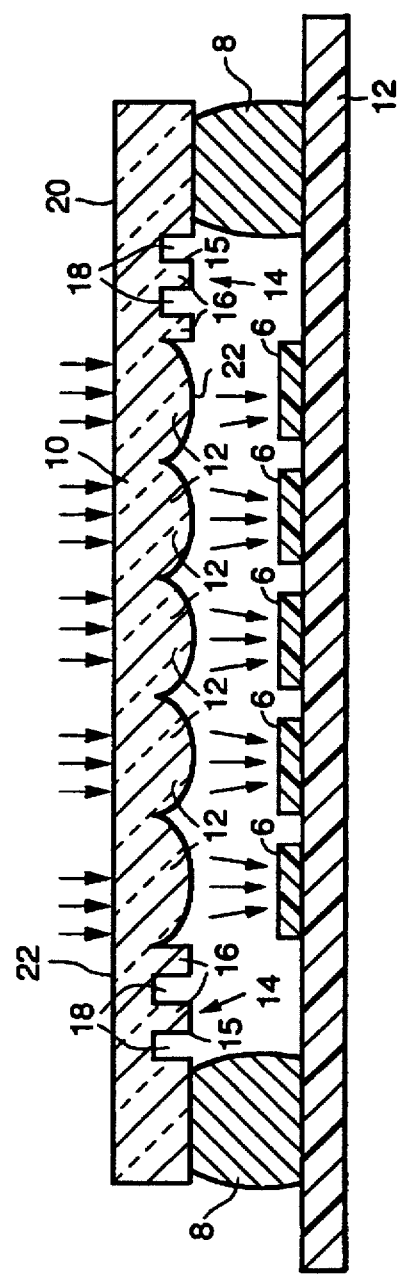
FIG. 4 is a sectional view of the IR detector Dewar assembly showing the focusing of IR radiation by the microlenses onto respective IR detector pixels.

The individual lenses in the IR microlens array are aligned with the respective IR detector pixels on the substrate, and are illustrated in an enlarged sectional view in FIG. 4. The recesses 18 defining the grating columns 16 and the microlenses 12 are both preferably etched into the surface of the IR window 10 using a conventional etching method for germanium, and can be etched in a single step or in two separate steps. Compared to a conventional flat surface for the deposition of a getter material, the getter grating greatly increases the available surface area on which the getter material is deposited. A greater column depth and a greater number of columns increase the total getter surface area. For example, if the etched column depth exceeds the grating column spacing, the getter grating increases the surface area by more than a factor of four over a flat surface getter. The getter material is preferably deposited as a layer 15 on the getter grating surface by a metal vapor deposition, with the IR window surfaces other than the grating area covered by a closely fitted metal shield to prevent the deposition of the getter material on those surfaces. Widely used getter materials include titanium, molybdenum and tantalum, which attract gas molecules and react with them to form metal oxides, carbides, hydrides and nitrides. These compounds are highly stable and relatively permanent at room temperature once they are formed, and therefore the risk of future gas release from these compounds is nearly nonexistent. Species of residual gas molecules that are usually found in an outgassed vacuum-sealed Dewar assembly include oxygen, nitrogen, hydrogen, methane, carbon monoxide and carbon dioxide. The most effective getter metal is tantalum, which removes hydrogen and carbon monoxide twice as fast as titanium and molybdenum.

As shown in FIG. 4, the microlenses 14 are convex lenses, and the microlens array is arranged so that each microlens is positioned above a respective detector pixel 6 to focus incoming IR radiation onto the pixel. The incident IR beam strikes the IR window's outer surface 20, which is preferably flat, is refracted by the convex curvature of each microlens 12 and strikes the active areas on the respective detector pixels, thereby reducing the amount of radiation that reaches the inactive areas on the substrate 2 not covered by the detector pixels, such as the gaps between the pixels. The surface of the microlenses 12 and the outer surface 20 of the IR window are preferably coated with a conventional anti-reflection coating 22 to reduce the reflection at these surfaces to improve the transmittance of IR radiation. The size and curvature of the microlenses are designed to sufficiently concentrate most of the radiation onto the detector pixels, although the IR beam generally need not be focused to form a very small spot area since the detector pixels generally have fill factors of about 60–80%. The height of the solder seal 8 determines the distance between the microlenses and the corresponding detector pixels, and therefore is also a factor in achieving a desired focusing. The incident IR beam typically has a cone with an f/# in the range of about f/2 to f/3. Assuming a diffraction limited system with the incident beam having an f/# between f/1 and f/3, each microlens is preferably an aspheric f/0.5 lens to clean up the spherical aberration. The Airy disk diameter d is related to the wavelength $\lambda$ and the f/# by $d=(2.44\ \lambda)(f/\#)$. For a f/0.5 lens and a wavelength of 10 μm, the Airy disk diameter is about 12 microns. The focal length is f/# times the lens diameter D. For a 50 μm diameter f/0.5 lens the focal length is about 25 microns. The height of the seal 8 is set at the calculated focal length. The diameter D of a square lens with a side length a is given by $D=(sqrt(2)/2)a$.

The whole Dewar assembly can be fabricated in a vacuum chamber using a conventional process such as that described in U.S. Pat. No. 5,433,639. Contaminants are removed from the substrate and the IR window as well as the solder and getter materials. The substrate and the IR window are then baked in the vacuum chamber at a temperature of about 250° C. to further remove the contaminants. The IR window, which is etched with the getter grating and the microlens array that is preferably coated with a conventional antireflection coating, has the window surface covered by a closely fitted metal shield except for the getter grating portion on which the getter material is deposited. The getter material, which is preferably either titanium for the ease of metal vapor deposition or tantalum for the best gas-trapping performance, is provided initially as a getter source, which is evaporated as a metal vapor in the vacuum, and the metal vapor is then condensed on the surface of the metal grating. The thickness of the deposition is not critical; with a large total surface area of the grating columns and recesses, a relatively thin layer of deposited getter material is usually sufficient to remove a relatively large number of gas molecules. The shield for covering other portions of the IR window is removed after the deposition. The metal vapor deposition of the getter grating can be performed in parallel with the processing of the substrate in a separate vacuum chamber. To fabricate the solder seal, a thick film of indium is preferably deposited onto narrow strips of the substrate surface surrounding the detector array, and a thin film of indium is preferably deposited on the corresponding surface of the germanium IR window. The two indium solder films are then cold welded or hybridized together in the vacuum chamber. The thicker of the two films is used as a spacer for setting the microlens array at the focal length. In the example described above with a calculated focal length of 25 μm, the spacer is set at about 25 μm. The IR window is then precisely aligned with the substrate, with each microlens positioned directly above a respective detector pixel on the substrate, and pressed onto the solder seal. The Dewar assembly is then cooled and the solder seal solidifies. The hermetically sealed Dewar assembly is thereby produced in the vacuum chamber, and can be removed from the chamber thereafter.

While illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A vacuum-sealed Dewar assembly, comprising:
   a substrate;
   a plurality of infrared (IR) detectors on said substrate; and
   an IR window comprising a plurality of microlenses positioned to focus IR radiation transmitting onto respective IR detectors, said IR window being sealed with respect to said substrate to form a substanially vacuum enclosure.

2. The Dewar assembly of claim 1, wherein said IR window is sealed with respect to said substrate by a separate seal.

3. The Dewar assembly of claim 1, wherein said microlenses comprise convex lenses.

4. The Dewar assembly of claim 1, wherein said microlenses are positioned within said enclosure opposite respective IR detectors.

5. The Dewar assembly of claim 1, further comprising an antireflection coating on said microlenses to enhance the transmittance of IR radiation.

6. The Dewar assembly of claim 1, wherein said IR window further comprises a plurality of protrusions having surfaces on which a getter material is positioned to chemically react with residual gas molecules in said enclosure to remove said gas molecules.

7. The Dewar assembly of claim 6, wherein said protrusions comprise rectangular columns defined by a plurality of recesses.

8. The Dewar assembly of claim 6, wherein said microlenses and said IR detectors occupy center portions of said IR window and substrate surfaces, respectively, and said protrusions are positioned adjacent edge portions surrounding said center portion of said IR window surface.

9. A vacuum-sealed Dewar assembly, comprising:
   a substrate;
   a plurality of infrared (IR) detectors on said substrate; and
   an IR window that is sealed with respect to said substrate to form a substantially vacuum enclosure and has a surface portion that is substantially transparent to at least some wavelengths of IR radiation so that said radiation is detectable by said IR detectors, said IR window comprising a plurality of protrusions having surfaces on which a getter material is positioned to chemically react with residual gas molecules in said enclosure to remove said gas molecules.

10. The Dewar assembly of claim 9, wherein said IR window is sealed with respect to said substrate by a separate seal.

11. The Dewar assembly of claim 9, wherein said protrusions comprise rectangular columns defined by a plurality of recesses.

12. The Dewar assembly of claim 9, wherein said IR window further comprises a plurality of microlenses positioned to focus said IR radiation onto respective IR detectors.

13. The Dewar assembly of claim 12, wherein said microlenses comprise convex lenses.

14. The Dewar assembly of claim 12, wherein said microlenses are positioned within said enclosure opposite respective IR detectors.

15. The Dewar assembly of claim 12, further comprising an antireflection coating on said microlenses to enhance the transmittance of said IR radiation.

16. The Dewar assembly of claim 12, wherein said microlenses and said IR detectors occupy center portions of said IR window and substrate surfaces, respectively, and said protrusions are positioned adjacent edge portions surrounding said center portion of said IR window.

17. An infrared (IR) window that is substantially transparent to at least some wavelengths of IR radiation, comprising:
   a first surface;
   a second surface having a portion contoured to form a plurality of microlenses and another portion contoured to form a plurality of grating columns defined by a plurality of recesses; and
   a getter material positioned on said grating column portion of said second surface adapted to chemically react with gas molecules to remove said gas molecules.

18. The IR window of claim 17, further comprising an antireflection coating positioned on said microlens portion of said second surface.

19. The IR window of claim 17, wherein said first surface comprises a substantially flat surface.

20. The IR window of claim 19, further comprising an antireflection coating positioned on said first surface.

* * * * *